United States Patent
Russell et al.

(10) Patent No.: US 6,774,489 B2
(45) Date of Patent: Aug. 10, 2004

(54) DIELECTRIC LAYER LINER FOR AN INTEGRATED CIRCUIT STRUCTURE

(75) Inventors: Steven W. Russell, Boise, ID (US); Wei William Lee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/938,260

(22) Filed: Aug. 23, 2001

(65) Prior Publication Data

US 2002/0024117 A1 Feb. 28, 2002

Related U.S. Application Data

(60) Provisional application No. 60/228,912, filed on Aug. 29, 2000.

(51) Int. Cl.⁷ .......................... H01L 23/48; H01L 23/52; H01L 29/40
(52) U.S. Cl. ...................... 257/752; 257/758; 438/633; 438/643; 438/653
(58) Field of Search ................................. 257/633, 640, 257/649

(56) References Cited

U.S. PATENT DOCUMENTS

| 5,646,440 | A | * | 7/1997 | Hasegawa ................... 257/635 |
| 5,650,639 | A | * | 7/1997 | Schrantz et al. ............... 257/77 |
| 5,818,071 | A | * | 10/1998 | Loboda et al. ................. 257/77 |
| 6,207,486 | B1 | * | 3/2001 | Nishiyama ................... 438/216 |
| 6,281,113 | B1 | * | 8/2001 | Maeda ........................ 438/624 |
| 6,316,734 | B1 | * | 11/2001 | Yang ........................... 174/256 |
| 6,362,094 | B1 | * | 3/2002 | Dabbaugh et al. .......... 438/637 |
| 6,365,959 | B2 | * | 4/2002 | Yuasa et al. ................. 257/646 |
| 6,429,129 | B1 | * | 8/2002 | Han et al. .................... 438/688 |
| 6,445,072 | B1 | * | 9/2002 | Subramanian et al. ....... 257/758 |
| 6,465,888 | B2 | * | 10/2002 | Chooi et al. ................. 257/751 |
| 6,485,815 | B1 | * | 11/2002 | Jeong et al. ................. 428/210 |
| 2002/0024119 | A1 | * | 2/2002 | Tanaka et al. ................ 257/649 |
| 2002/0025405 | A1 | * | 2/2002 | Huang et al. ................ 438/618 |
| 2002/0167090 | A1 | * | 11/2002 | Hsue et al. .................. 257/762 |
| 2002/0190299 | A1 | * | 12/2002 | Hsue et al. .................. 257/303 |

* cited by examiner

*Primary Examiner*—Jerome Jackson
*Assistant Examiner*—Jesse A. Fanty
(74) *Attorney, Agent, or Firm*—Jacqueline J. Garner; W. James Brady, III; Frederick J. Telecky, Jr.

(57) ABSTRACT

An integrated circuit structure (8) includes a plurality of solid state electronic devices and a plurality of conductive elements (12, 14) that electrically couple the electronic devices. The integrated circuit structure (8) also includes a dielectric layer (16) positioned between two or more of the conductive elements (12, 14). A liner (18) is positioned between at least a portion of the dielectric layer (16) and a conductive element (12, 14). The liner (18) is formed from a compound that includes silicon and either carbon and nitrogen.

10 Claims, 3 Drawing Sheets

DIELECTRIC LAYER LINER FOR AN INTEGRATED CIRCUIT STRUCTURE

This application claims priority under 35 USC § 119(e)(1) of provisional application No. 60/228,912 filed Aug. 29, 2000.

TECHNICAL FIELD OF THE INVENTION

This invention relates generally to the field of semiconductor devices, and more particularly to an improved dielectric layer liner for an integrated circuit.

BACKGROUND OF THE INVENTION

Modern integrated circuits contain thousands of solid state electronic devices on a single chip. As the number of devices on a given chip increases, more levels of metallization are required to electrically couple the devices. The levels of metallization are built on top of each other and separated by a dielectric layer which prevents interference from one level to the next. Moreover, within a given metal level, the horizontal distance separating metallization lines must be reduced in order to minimize the chip size as device density increases. At the same time, metallization resistance and capacitance must be minimized in order to meet speed and performance requirements. Unfortunately, as the spacing decreases, the intralevel (on the same metal level) and interlevel (between metal levels) capacitances increase if a dielectric layer having the same dielectric constant is used.

Traditionally, the dielectric materials used to isolate metallization lines within the same level and between two different levels have had relatively high dielectric constants. For example, undoped and doped silicon dioxide layers such as borophosphosilicate glass (BPSG), phosphosilicate glass (PSG), and plasma and chemical vapor deposited tetraethylorthosilicate based (TEOS) oxides have been used as dielectric layers in multi-metallization structures. The semiconductor industry's continuing demand for integrated circuits with ever increasing device densities and operating speeds requires dielectric materials having low dielectric constants in order to reduce capacitance between metallization lines and the speed degradation that results from this capacitance. However, although low dielectric constant materials typically provide reduced capacitance, many of these materials may also have shortcomings (such as an associated high leakage current) that need to be addressed.

SUMMARY OF THE INVENTION

According to the present invention, disadvantages and problems associated with previous integrated circuit structures have been substantially reduced or eliminated.

According to one embodiment of the present invention, an integrated circuit structure includes a plurality of solid state electronic devices and a plurality of conductive elements that electrically couple the electronic devices. The integrated circuit structure also includes a dielectric layer positioned between two or more of the conductive elements. A liner is positioned between at least a portion of the dielectric layer and a conductive element. The liner is formed from a compound that includes silicon and either carbon and nitrogen.

The present invention provides a number of important technical advantages. For example, the present invention provides a liner for use in conjunction with dielectric layers that reduces leakage current associated with certain low dielectric constant materials used for the dielectric layers. In one embodiment, this liner is made from silicon nitride; however, other appropriate materials may be used. Unlike previous dielectric layer liners, such as tetraethylosilicate (TEOS), the liner of the present invention reduces leakage current while also reducing the capacitance of the combined dielectric layer and liner. This capacitance is reduced even though the silicon nitride and other appropriate materials have a higher dielectric constant than TEOS and other previous liner materials. The reduction in capacitance is due, at least in part, to the relative thinness of the liner materials of the present invention. Other important technical advantages are readily apparent to those skilled in the art from the following figures, descriptions and claims.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE INVENTION

Figure 1:
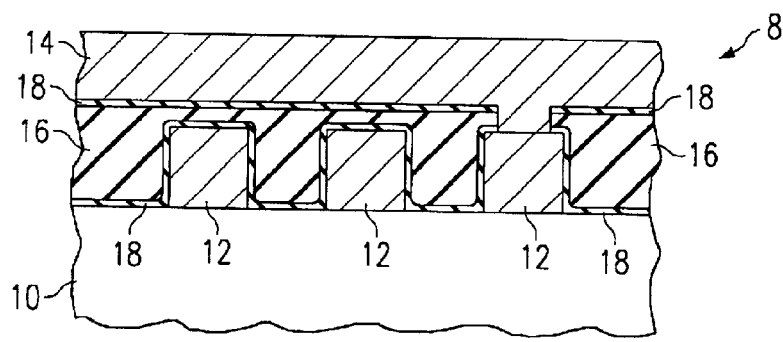
FIG. 1 illustrates a simplified view of a portion of an exemplary integrated circuit structure having a dielectric layer and associated liner.

FIG. 1 illustrates a simplified view of a portion of an exemplary integrated circuit structure 8 having an exemplary dielectric layer 16 and associated liner 18. It should be understood that the present invention may be used in conjunction with numerous types and configurations of integrated circuits and is no way limited by exemplary integrated circuit 8 illustrated in FIG. 1. Exemplary integrated circuit 8 includes a substrate 10 to which numerous metallization lines 12 or other conductive elements are coupled. Substrate 10 may include a semiconductor material in or on which one or more solid state electronic devices are formed. For ease of description, the electronic devices are not shown, but it should be understood that any appropriate semiconductor devices, including but not limited to, bipolar and MOS transistors, MESFETs, JFETs, resistors, capacitors, and inductors, may be formed in or on substrate 10 using well-known techniques. Metallization lines 12 are each coupled to one or more of these electronic devices in substrate 10 and are used to couple devices in substrate 10 to each other and to other devices in levels disposed above substrate 10. Metallization lines 12 may be coupled to conductive elements of devices in substrate 10 through contact holes in a insulation layer or layers between metallization lines 12 and the devices. A metallization line or lines 14, which are connected to one or more electronic devices on a level above substrate 10, may be coupled to metallization lines 12 to interconnect electronic devices on the different levels.

Since metallization lines 12 and 14 carry electrical current, these lines are typically required to be insulated from one another to prevent transfer of current from one line to another. A dielectric layer 16 is used to provide this insulation. The illustrated dielectric layer 16 may be referred to as both an intra-level and an inter-level dielectric since it provides insulation between metal conductors in the same level (for example, between metallization lines 12) and between metal conductors in different levels (for example, between metallization lines 12 and 14). However, in certain embodiments, dielectric layer 16 may be only a intra-level or only an inter-level dielectric layer. Furthermore, although metal lines 12 and 14 are described, dielectric layer 16 (and liner 18, described below) may also be used as insulation for types of conductive elements other than metals, such as polysilicon or other appropriate materials.

Among many other desired properties, it is typically desired that dielectric layer 16 provide a low leakage current (high resistivity) and have a low dielectric constant (k) to keep the capacitance between metallization lines 12 and/or 14 low. In order to reduce capacitance in integrated circuits having large device densities (and thus increasingly smaller dielectric layers between metal conductors), materials having relatively low dielectric constants ("low-k" materials) may be used. Such materials may include, but are not limited to, polytetraflouroethylene (PTFE), fluorinated ethylenepropylene (FEP), fluoromethacrylate (Fac), perfluoroalkoxy polymer (PFA), silicon oxyflouride (FSG), hydrogen silsesquioxane (HSQ), nanoporous silica, flourinated polyimide, poly(arylene) ether, parylene AF4, divinyl siloxane bisbenzocyclobutene (DVS-BCB), aromatic hydrocarbon, and hybrid-silsesquioxanes.

Although a dielectric layer 16 using a low-k material may provide the desired reduced capacitance, certain low-k materials do not provide all of the characteristics of an optimal dielectric layer 16. For example, although a low-k material (for example, PTFE) may provide low capacitance, such a material may not meet the leakage current (resistivity) requirements of some applications. In these cases, a liner 18 may be used between dielectric layer 16 and metallization lines 12 and/or 14 to reduce leakage current. One example of a material used as a liner 18 is plasma-enhanced tetraethylosilicate (PETEOS). PETEOS is tetraethylosilicate that is deposited using a plasma-enhanced chemical vapor deposition (PECVD) process. A PETEOS liner 18 used in conjunction with a dielectric 16 acts to reduce the leakage of current from metallization lines 12 and/or 14. For example, a liner 18 having thickness of approximately 1000 Angstrom (Å) used in conjunction with a PTFE dielectric layer 16 having a thickness of approximately 0.75 micrometers ($\mu$m) has been shown to reduce the leakage current from approximately $10^{-7}$ (for unlined PTFE) to approximately $10^{-11}$ (for PETEOS-lined PTFE) under certain parameters.

However, since PETEOS has a high dielectric constant compared to PTFE (approximately 4.1 and 2.0, respectively), the capacitance of the lined PTFE or other low-k dielectric layer 16 is increased as compared to the unlined PTFE dielectric layer 16. Therefore, although a PETEOS liner 18 reduces the leakage current, it detrimentally increases the capacitance of the lined dielectric layer 16. Therefore, it is desirable to replace the PETEOS liner 18, as well as other liner materials that create this increased capacitance, with a liner material that minimizes both the leakage current and the capacitance.

As an example only and not by way of limitation, silicon nitride may be used as such a material for liner 18. Although silicon nitride has a higher dielectric constant than PETEOS (approximately 8.0 and 4.1, respectively), a liner 18 of silicon nitride may be much thinner than a liner of PETEOS and still provide similar reduction of leakage current. As an example only and not by way of limitation, a liner 18 of silicon nitride may be approximately thirty percent as thick as a liner 18 of PETEOS (for example, 300 Å versus 1000 Å). Therefore, although the dielectric constant of silicon nitride is approximately double that of PETEOS, the large reduction in thickness acts to reduce the capacitance of the silicon nitride-line dielectric layer 16 as compared to the PETEOS-lined dielectric layer 16. For example, an approximately ten percent reduction in capacitance may be achieved when a silicon nitride liner 18 is used instead of a PETEOS liner 18 in conjunction with a PTFE dielectric layer 16. Although the use of a silicon nitride liner 18 may slightly increase the leakage current, the increased leakage current is still within typical specifications and is insignificant in relation to the decrease in capacitance.

Although the a silicon nitride liner 18 is described above in conjunction with a PTFE dielectric layer 16, a silicon nitride liner 18 may also be used in conjunction with any other appropriate dielectric layers 16. Furthermore, materials other than silicon nitride that have similar properties as described above may be used as a liner 18. These materials may include, but are not limited to, silicon oxy-nitride, silicon boron-nitride, silicon carbide, silicon oxy-carbide, silicon boron-carbide, and other appropriate chemical compounds that are combinations of silicon, nitrogen, carbon, boron, and/or oxygen.

Figure 2A:
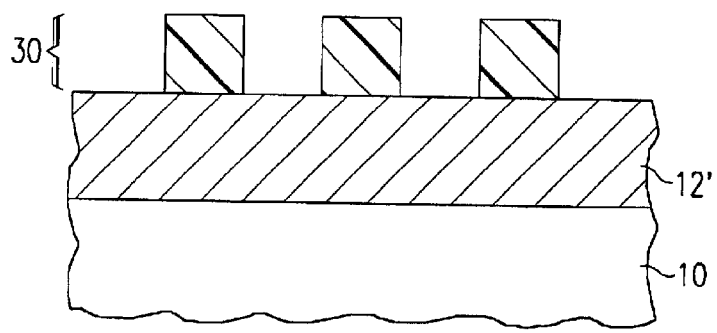
FIG. 2A illustrates an exemplary layer of metal and a mask deposited on a semiconductor substrate.
Figure 2B:
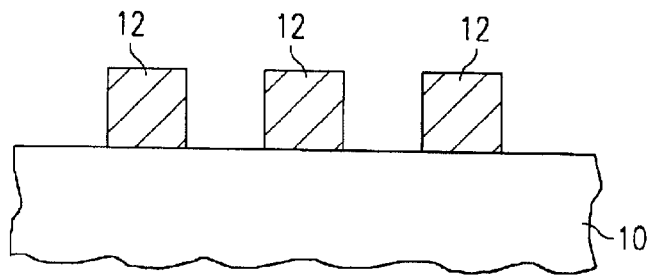
FIG. 2B illustrate exemplary metallization lines resulting from an etching of the layer of metal of FIG. 2A.

FIGS. 2A–2I illustrates a sequence of steps in the formation of integrated circuit 8 of FIG. 1. FIG. 2A illustrates an exemplary layer of metal 12' and an exemplary mask 30 deposited on semiconductor substrate 10. As described above, one or more solid state electronic devices may be included in and on substrate 10, although these devices are not illustrated for purposes of simplicity. Metal layer 12' may be formed by depositing a layer of aluminum, aluminum-copper alloy, copper, or other appropriate metal on a preferably planar layer of substrate 10. The metal may be deposited on substrate 10 using physical vapor deposition (PVD) or any other appropriate technique. The metal is then masked with a mask 30 of resist or other appropriate material as in well known in the art and is etched using any of several well-known techniques. This etching procedure results in the formation of exemplary metallization lines 12, as illustrated in FIG. 2B. Metallization lines 12 may be connected to electronic devices in substrate 10 through the use of vias that may pass through an insulating layer, such as a dielectric layer, of substrate 10 upon which metal layer 12' is deposited. The metal of metallization lines 12 fills the vias and contacts a conductive element of one or more of the devices. The number and location of vias is determined by the underlying circuit design.

Figure 2C:
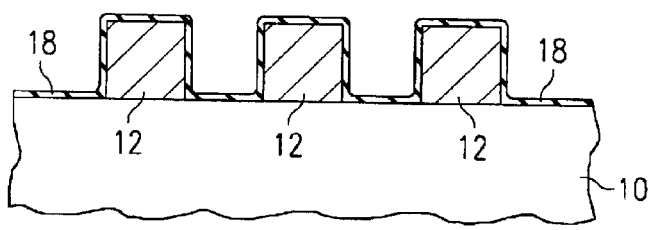
FIG. 2C illustrates an exemplary liner applied on and between the exemplary metallization lines of FIG. 2B.

FIG. 2C illustrates an exemplary liner 18 applied on and between metallization lines 12. As described above, liner 18 is used as a barrier between metallization lines 12 and dielectric layer 16. Liner 18, which may be formed from silicon nitride or other appropriate materials, may be applied using chemical vapor deposition (CVD), plasma-enhanced CVD (PECVD), a spin-on process, or any other appropriate technique.

Figure 2D:
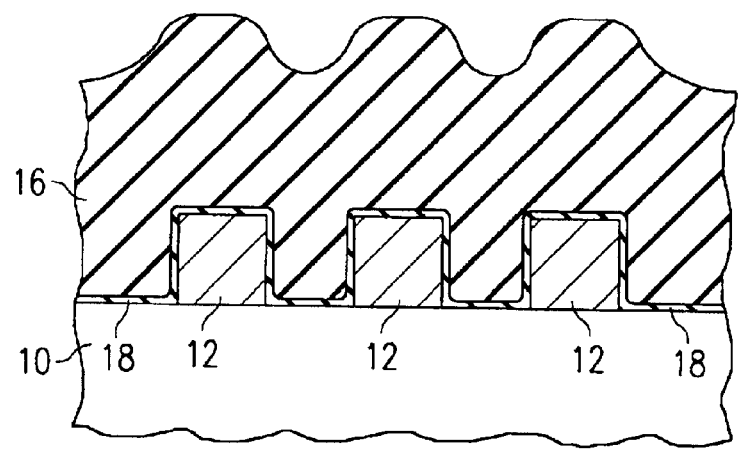
FIG. 2D illustrates an exemplary dielectric layer applied on the liner and between the metallization lines of FIG. 2C.

FIG. 2D illustrates an exemplary dielectric layer 16 applied on liner 18 and between metallization lines 12. The material used for dielectric layer 18 is applied in sufficient thickness to fill the areas between metallization lines 12 and to provide a insulating layer above the upper surface of metallization lines 12. The thickness of dielectric layer 16 may be selected so as to minimize capacitance or to meet numerous other requirements and is typically thicker than liner 18. As with liner 18, dielectric layer 16 (which may be formed from any number of suitable materials) may be applied using CVD, PECVD, a spin-on method, or any other appropriate technique. For example, if PTFE is used as the material for dielectric layer 16, the PTFE may be applied using a spin-on process; however, CVD or other techniques may be used.

In a spin-on process, substrate 10 and the layers deposited on substrate 10 are rapidly spun and the PTFE or other dielectric material is dropped in a liquid form onto the spinning substrate 10. Spin-on application disperses the material across the spinning substrate 10 (in the illustrated example, on top of liner 18) and typically results in the material being deposited with a varying thickness across substrate 10. The thickness of the material usually will be thicker in areas where the width of the gap between metallization lines 12 is narrow. The filling of the gap between metallization lines 12 is affected by several characteristics including the degree of wetting of the liquid on the top layer above substrate 10 (for example, liner 18), the volume and aspect ratio of the gaps, the viscosity of the liquid, the spin speed, and the nominal thickness of the liquid on the field or widely spaced areas. For a particular metallization line spacing, a combination of the above parameters is chosen to result in full coverage of the area between metallization lines 12.

Figure 2E:
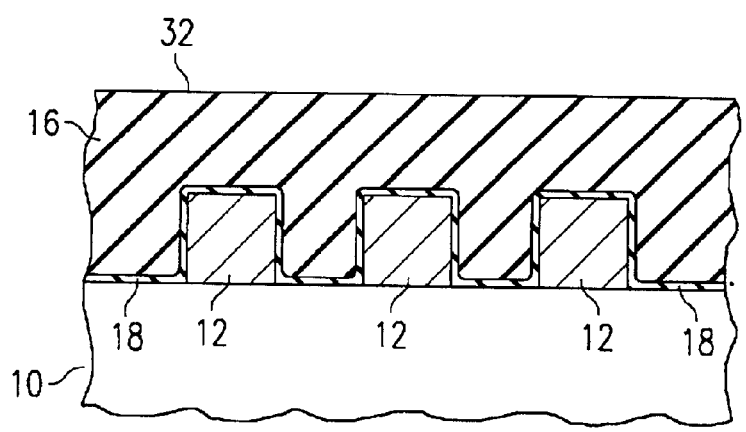
FIG. 2E illustrates the dielectric layer of FIG. 2D after a planarization has been performed.

FIG. 2E illustrates dielectric layer 16 after a planarization has been performed. The upper surface 32 of dielectric layer 16 may be planarized to reduce the ruggedness of the topography of the finished integrated circuit. Such planarization is especially useful when there are numerous levels of devices in integrated circuit 8 (and thus numerous layers of materials). This planarization may be performed in any appropriate number of steps using any suitable techniques, such as chemical mechanical polishing (CMP).

Figure 2F:
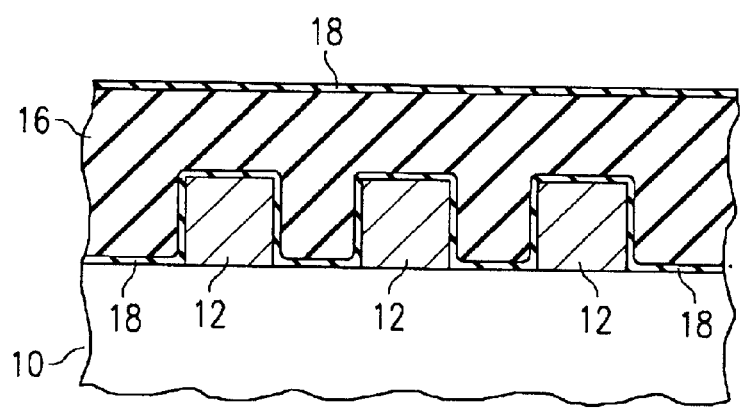
FIG. 2F illustrates the application of a second liner on the planarized dielectric layer.

FIG. 2F illustrates the application of a second liner 18 over dielectric layer 16. As described above, the first liner 18 is used as a barrier between metallization lines 12 and dielectric layer 16. In this case, the second liner 18 acts as a barrier between dielectric layer 16 and metallization lines 14 to be applied in a future step (to couple a device or devices in substrate 10 with a device or devices in a level above substrate 10). As with the first liner 18, second liner 18, which may be formed from silicon nitride or other appropriate materials, may be applied using CVD, PECVD, a spin-on process, or any other appropriate technique. It should be noted that although two liners 18 are illustrated, a single liner 18 may be used. As described above, the illustrated integrated circuit 8 is only an example and countless other configurations of integrated circuits may use one or more liners in conjunction with one or more dielectric layers. The present invention applies to the use of one or more liners, as described above, in any appropriate configuration.

Figure 2G:
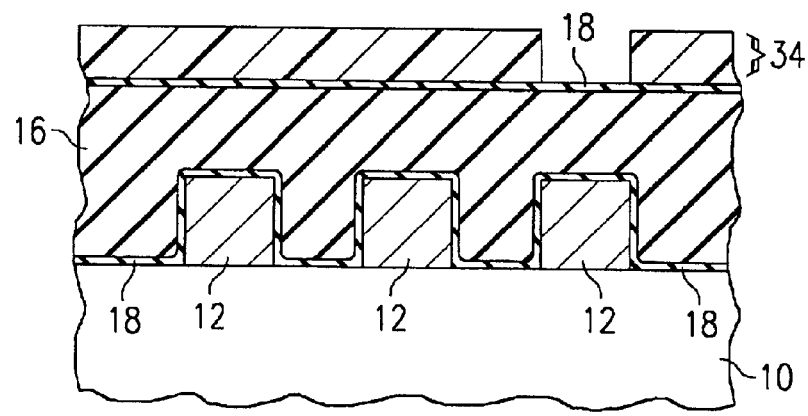
FIG. 2G illustrates the structure of FIG. 2F with an exemplary mask applied on the second liner.
Figure 2H:
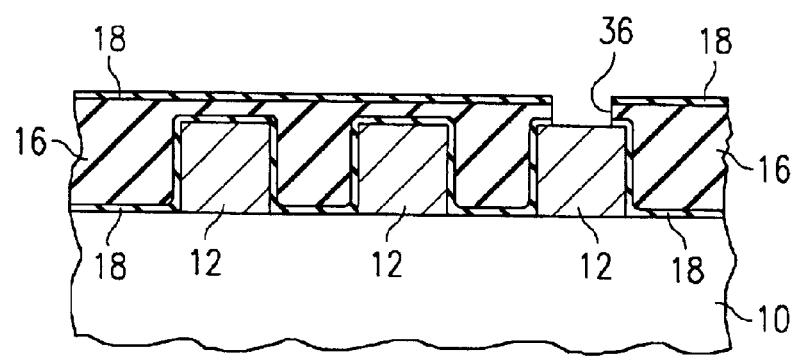
FIG. 2H illustrates an exemplary via formed by an etching of the structure of FIG. 2G.

FIG. 2G illustrates the structure of FIG. 2F with an exemplary mask 34 applied on second liner 18. Second liner 18 may be masked with resist or other appropriate material as in well known in the art such that a via may be etched through second liner 18 and dielectric layer 16 to a metallization line 12. The etching may be performed using any of several well-known techniques. An etch-stop layer may be formed on top of metallization line 12 in order to prevent metallization line 12 from being etched. Alternatively, an etching process may be used that does not etch the metal. FIG. 2H illustrates a via 36 that is formed by the etching process. Via 36 is used to connect a metallization line 12 to a metallization line 14 of another level. If an etch-stop layer was used, this layer may be removed to allow an electrical contact between these metallization lines, as described below.

Figure 2I:
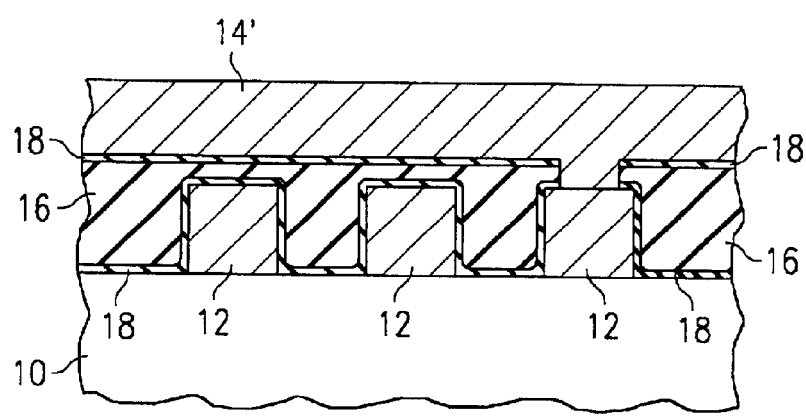
FIG. 2I illustrates an exemplary metal layer deposited on the second liner and in the via of FIG. 2H.

FIG. 2I illustrates an exemplary metal layer 14' deposited on second liner 18 and in via 36. Metal layer 14' may be formed by depositing a layer of aluminum, aluminum-copper alloy, copper, or other appropriate metal on second liner 18 and into via 36 such that metal layer 14' forms an electrical connection with the metallization line 12 exposed by via 36. The metal may be deposited on second liner 18 using physical vapor deposition (PVD) or any other appropriate technique. After this deposition, metal layer 14' may be masked and etched, as described above, to create one or more metallization lines 14. Metallization lines 14 may be connected to electronic devices in a level above substrate 10 such that these devices may be electrically coupled to devices in substrate 10 to which the exposed metallization line 12 is coupled.

Although the use of a liners 18 in conjunction with dielectric layer 16 has been described in relation to a subtractive etch process, liners 18 and dielectric layer 16 may also be used in conjunction with a damascene or other appropriate fabrication process. Although dielectric gap fill between metallization lines 12 is typically not an issue with damascene (since metallization lines 12 are formed by depositing metal into recesses etched into a dielectric layer instead of depositing the dielectric material between previously etched metallization lines 12), the use of liners 18 in a similar manner as described above still proves useful since the deposited dielectric layer is typically thicker than dielectric layers used in a subtractive etch process. This thicker dielectric layer results in a high capacitance that may be reduced through the use of one or more liners 18 of the present invention.

Although the present invention has been described with several embodiments, numerous changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. An integrated circuit structure, comprising:

at least two metal interconnect lines;

a liner comprising silicon boron-carbide located on and between said metal interconnect lines; and a dielectric layer positioned between said metal interconnect lines, the liner positioned between at least a portion of the dielectric layer and the metal interconnect lines.

2. The integrated circuit structure of claim 1, wherein the dielectric layer comprises an intralevel dielectric layer positioned between metal interconnect lines in a level of the integrated circuit structure.

3. The integrated circuit structure of claim 1, wherein the dielectric layer comprises an interlevel dielectric layer positioned between conductive elements in different levels of the integrated circuit structure.

4. The integrated circuit structure of claim 1, wherein the dielectric layer comprises a fluorinated dielectric material.

5. The integrated circuit structure of claim 1, wherein the dielectric layer comprises polytetraflouroethylene (PTFE).

6. An integrated circuit structure, comprising:
   at least two metal interconnect lines;
   a liner comprising silicon oxy-carbide located on and between said metal interconnect lines; and
   a dielectric layer positioned between said metal interconnect lines, the liner positioned between at least a portion of the dielectric layer and the metal interconnect lines.

7. The integrated circuit structure of claim 6, wherein the dielectric layer comprises an intralevel dielectric layer positioned between metal interconnect lines in a level of the integrated circuit structure.

8. The integrated circuit structure of claim 6, wherein the dielectric layer comprises an interlevel dielectric layer positioned between conductive elements in different levels of the integrated circuit structure.

9. The integrated circuit structure of claim 6, wherein the dielectric layer comprises a fluorinated dielectric material.

10. The integrated circuit structure of claim 6, wherein the dielectric layer comprises polytetraflouroethylene (PTFE).

* * * * *